Figure 1:
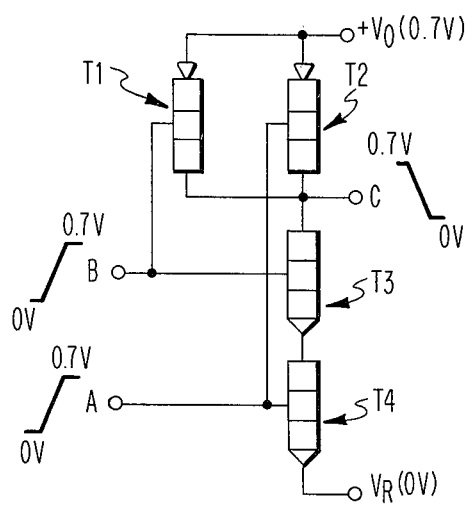

United States Patent [19]
Berger et al.

[11] 3,956,641
[45] May 11, 1976

[54] COMPLEMENTARY TRANSISTOR CIRCUIT FOR CARRYING OUT BOOLEAN FUNCTIONS

[75] Inventors: Horst H. Berger, Sindelfingen; Siegfried K. Wiedmann, Stuttgart, both of Germany

[73] Assignee: International Business Machines Corporation, Armonk, N.Y.

[22] Filed: Feb. 11, 1975

[21] Appl. No.: 549,116

[30] Foreign Application Priority Data
May 31, 1974 Germany............................ 2426447

[52] U.S. Cl............................... 307/215; 307/255; 307/313; 307/213; 357/4; 357/35; 357/44; 357/46; 357/49
[51] Int. Cl.².................. H03K 19/34; H03K 19/36
[58] Field of Search ........... 307/203, 207, 213, 215, 307/214, 255, 313; 357/4, 35, 44, 46, 49

[56] References Cited
UNITED STATES PATENTS
3,401,359  9/1968  Becker............................ 307/251 X
3,541,353  11/1970  Seelbach et al................. 307/215 X

*Primary Examiner*—John Zazworsky
*Attorney, Agent, or Firm*—Wesley De Bruin

[57] ABSTRACT

Integrated circuit devices for carrying out boolean logic functions of at least two input variables.

The integrated circuit device for carrying out the logical function of at least two input variables is characterized as follows: the transistors employed are bipolar transistors of a first conductivity type and of a second conductivity type opposite to said first conductivity type; the input variables are coupled respectively to the control electrodes of a first transistor of said first conductivity type, and of a second transistor of said second conductivity type provided in the load branch of said first transistor; said bipolar transistors of said first conductivity type and of said second conductivity type having essentially symmetrical switching characteristics, particularly their current gain factors in normal and inverted direction.

For a NOR or NAND function first bipolar transistors arranged in series or parallel, of the one conductivity type, e.g. NPN transistors, are provided, in accordance with the number of input variables. Connected thereto, quasi in the load branch, are an equal number of second bipolar transistors of the opposite conductivity type, e.g. PNP transistors which are combined in parallel or series arrangement. The point of connection of the first and second transistors is the circuit output. The input signals are applied to the respective interconnected control electrodes of two transistors that are complementary to each other.

33 Claims, 7 Drawing Figures

COMPLEMENTARY TRANSISTOR CIRCUIT FOR CARRYING OUT BOOLEAN FUNCTIONS

BACKGROUND OF THE INVENTION

The invention relates to a complementary transistor circuit for carrying out boolean functions of at least two input variables. More particularly, the invention relates to a complementary transistor circuit for carrying out boolean functions of at least two input variables in integrated semiconductor devices having high circuit density and fabricated by large scale integration techniques.

Circuitries for executing such functions are extensively employed in electronic data processing systems, where they realize the logic and time correlations of data signals required in a multitude of uses. In the course of the growing development in this field extensive efforts have been made for many years and continue to be made to provide circuits of this type which are quicker, more reliable, and more economic with respect to their costs.

From the point of view of reliability and manufacturing costs — similarly to the development in the storage field — the development of such circuitries showed at quite an early stage a tendency towards integrated or integratable, form, i.e. microminiaturized concepts with high component packing density. Consequently, circuits were used which were composed, if possible, preponderantly, of transistors, avoiding as far as possible any resistors, e.g. the so-called TTL circuits.

With an increasingly intensified packing density, however, the question of heat transfer becomes more and more important. Circuits designed with a high density permit for example, use in portable, battery-operated systems, with the added demand for extremely low power consumption. For the selection of a respective circuit technology it had to be carefully considered whether such circuits should be made with bipolar transistors, permitting high operating speeds but regularly generating higher dissipation, or with unipolar, i.e. field effect transistors which are slower but present fewer heat problems. A suitable factor for comparing such alternative circuit technologies can be the power X delay product, ("Microelectronics and Reliability," by H. C. Josephs, Pergamon Press, 1965, Vol. 4, pp. 345 to 350). Considering this factor, theoretically bipolar circuit technologies appear to be of advantage, particularly when they are designed in complementary technology. Up to now, however, the only complementary circuits of this type with bipolar transistors have been inverters which cannot be used as the only means for constructing logic systems. For that reason, the development of complementary logic circuits tended in the following period towards CMOS circuits exclusively.

More recently, a semiconductor arrangement with complementary bipolar transistors has become known which can be made in accordance with the so-called Stanford Complementary Process. See S. C. Su and J. D. Meindl in "IEEE Journal of Solid-State Circuits," Vol. SC-7, No. 5, October 1972, pp 351 to 357. The logic circuits based thereon and suggested there, however, also consist of inverters only with complementary bipolar transistors to which conventionally structured multi emitter or diode logic circuits are arranged in series. With respect to a circuit logic realized with complementary transistors only the CMOS circuit technology is available at present.

The object of the invention is to provide a further improved circuit technology for carrying out boolean functions which offers in particular an improved power $x$ delay product. Where, the respective logic gates are such that they may be directly coupled to each other without any additional or intervening circuits. Furthermore, the logic circuitries may easily be realized as an integrated circuit with a high packing density.

A primary object of the invention is to provide an improved transistor circuit for carrying out boolean functions of at least two input variables.

A primary object of the invention is to provide an improved transistor circuit utilizing complementary bi-polar transistor and performing a logical function.

A primary object of the invention is an improved logic circuit.

A primary object of the invention is to provide an improved logic circuit that is fast and reliable in operation, economical and relatively simple to manufacture, and has minimum power requirements.

A primary object of this invention is to provide an improved NOR or NAND circuit, where the improvements include improvements in the following parameters: (a) switching speed (b) reliability of operation (c) power requirements (d) power $x$ delay product (e) ease of manufacture (f) cost of manufacture (g) density of circuitry in integrated circuit devices.

A primary object of this invention is to provide an improved structure of a semiconductor device fabricated by large scale integration techniques.

A primary object of this invention is to provide an improved structure of a semiconductor device fabricated by large scale integration where at least certain of the transistors are laterally disposed.

A primary object of this invention is to provide an improved NOR circuit.

A primary object of this invention is to provide an improved NAND circuit.

The foregoing and other objects, features and advantages of the invention will be more apparent from the following more particular description of the preferred embodiments of the invention, as illustrated in the accompanying drawings.

The invention will be described below on the basis of preferred embodiments, and by reference to the drawings.

Figure 2A:
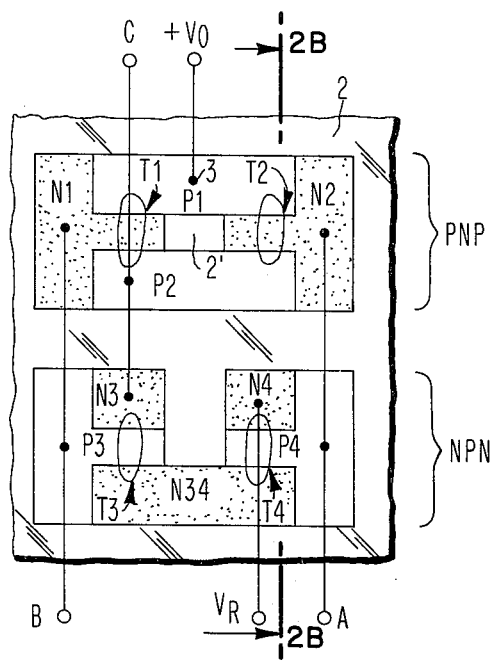
Figure 2B:
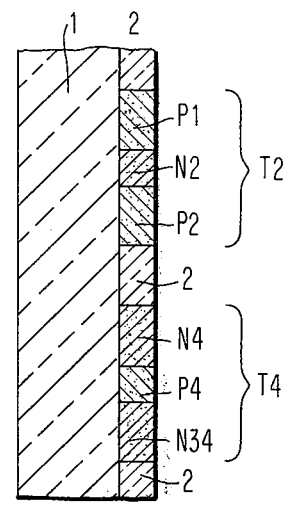
Figure 2C:
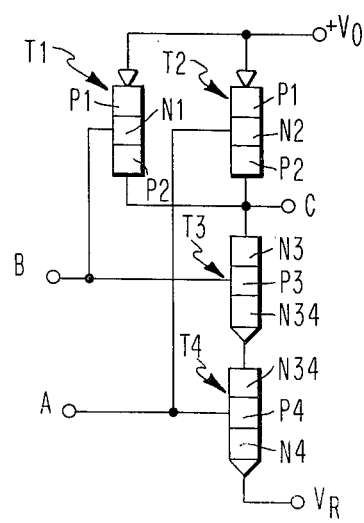
Figure 3:
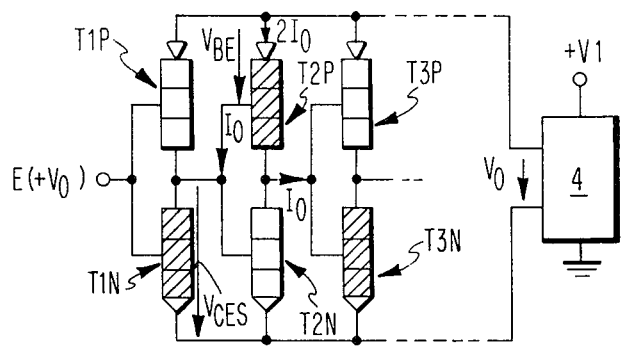
Figure 4:
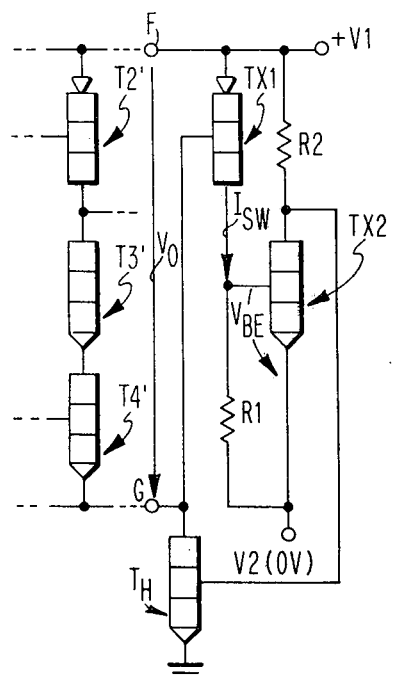

In the drawings, the Figures show the following:

FIG. 1 - the electric circuit diagram of a NAND or NOR gate, respectively, according to an embodiment of the invention;

FIGS. 2A, 2B and 2C respectively disclose an advantageous integrated embodiment of the circuit of FIG. 1, in a plan view (2A) in a sectional view (2B) as well as in a circuit representation (2C) each with information concerning the realization of the transistors in specific semiconductor zones;

FIG. 3 discloses the circuit diagram of an inverter chain for demonstrating the principles forming the basis of the invention;

FIG. 4 discloses an advantageous control circuit for the voltage supply, and

Figure 5:
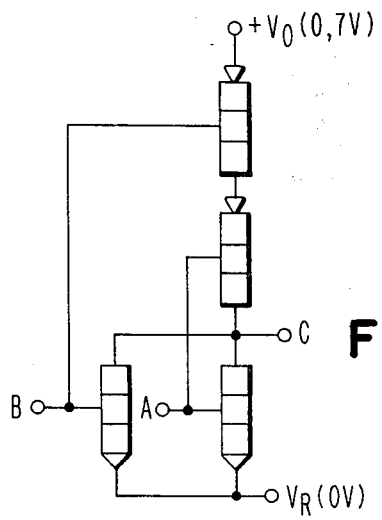

FIG. 5 discloses an embodiment of the invention.

While all known bipolar complementary logic circuits have the disadvantage that a passive switching element— mostly an ohmic resistance - is necessary for re-charging the switching capacity of the decoupling elements, FIG. 1 shows the electric circuit diagram of a novel bipolar complementary logic circuit consisting of active transistors exclusively, each one of these transistors performing a switching function. The circuit in accordance with FIG. 1 represents a basic circuit for carrying out a NAND function (positive logic), or a NOR function (negative logic) for a case of two input variables A and B. It is a known fact that all complex logic functions may be realized by the combinations of only such NAND or NOR functions (fundamental system).

The logic gate of FIG. 1 consists of the two series-connected NPN transistors T3 and T4 to which are arranged in series the parallel connection of the PNP transistors T1 and T2. The connected emitters of PNP transistors T1 and T2 are joined to positive supply voltage $V_O$. The other pole of the supply voltage is connected to the emitter of T4 and designated $V_R$ in the drawing. For the below given explanation of the functioning of this circuit it is assumed that this reference voltage $V_R$ has ground potential so that the total operating voltage applied at the circuit amounts to $V_O$. Output C of the logic gate is taken at the point of connection of the series arrangement of the NPN transistors and the parallel arrangement of the PNP transistors. Input A is impressed on the base of NPN transistor T4 as well on to the base of PNP transistor T2. Correspondingly, input B is impressed on the base of NPN transistor T3, and the base of PNP transistor T1.

Each of the transistors T1, T2, T3 and T4 have the following properties or characteristics:

1. low saturation voltage $V_{CES}$, in the order of a few millivolts;
2. current gains with normal and inverted operation very high, i.e.

$$\beta_N >> 1, \beta_I >> 1;$$

3. the PNP and NPN transistors have substantially the same current/voltage characteristics.

With properties or characteristics, the realization of which will be explained and discussed hereinafter, supply voltage $V_O$ corresponds approximately to the base-emitter voltage of the conductive PNP or NPN transistors. The supply voltage is set in such a manner, e.g. via the control circuit to be described in connection with FIG. 4, that in the off state there flows a predetermined adjustable base current $I_{BO}$. The currents which are essential in a switching operation for the charging of the switching capacity at the output are then higher by the factor $\beta$ (approximately 100) so that the switching speed is much higher than in logic circuits with passive elements, or that with the same switching speed the power dissipation is much lower.

For the description of the function of the logic circuit of FIG. 1 it is assumed that the supply voltage $+V_O = 0.7$ Volts and $V_R = 0$ Volts. The input signals or input variables A and B, respectively, are to be able to adopt one of the two predetermined voltages, namely 0 Volts or 0.7 Volts. It is obvious that at output C potential $V_R = 0$ appears only in those cases where both input variables (A, B) show the upper voltage level $V_O = 0.7$ Volts. In that case, both PNP transistors T1 and T2 are off, so that lower voltage level $V_R$ applied to T4 is applied to output C. If the upper voltage level is correlated to the binary 1, and the lower voltage level to the binary 0 (positive logic), the circuit of FIG. 1, therefore, performs a NAND function of input variables A and B. With an opposite correlation of the voltage levels to the binary values a NOR function is obtained. It will be appreciated by persons skilled in the art that the circuit described can be extended to more than two inputs. Of course, the PNP and NPN transistors of FIG. 2C can also be exchanged — with a simultaneous reversal of the voltage polarities. Then with a positive logic a NOR gate is obtained.

The above mentioned conditions for the functioning of the novel bipolar complementary circuitry technology can be realized in accordance with an advantageous embodiment of the invention with the semiconductor structure shown in FIG. 2A in a plan view, and in FIG. 2B in a sectional view. FIG. 2C once more shows the circuit of FIG. 1, the individual transistor zones having been marked in such a manner that it is easier to locate the respective semiconductor zones in the integrated embodiment in accordance with FIGS. 2A annd 2B. The integrated semiconductor structure shown in FIGS. 2A and 2B is based on process steps which have been developed mainly for modern field effect transistors and which in the meantime have become well known and mastered in the art. In this embodiment, sapphire is provided as a carrier or substrate material 1. The semiconductor zones applied thereon consisting for instance of silicon and being zone-wise separated from each other by means of an oxide isolation 2. All transistors are designed as lateral transistors, i.e. contrary to so-called vertical transistors the emitter, base, and collector zones of the transistors are provided in a laterally spaced arrangement. As the sapphire is an isolator the carrier injection is performed only in the lateral direction. By suitably dimensioning the distances and dopings of the respective zones the high current gains required can be realized, as shown below with an actual embodiment. Owing to the symmetry of the collector and emitter zones the current gains $\beta_N$ and $\beta_I$ are equal. The zone distances of the PNP and NPN transistors are defined advantageously by the same mask, which can be effected by means of the selective etching processes known per se, using double layers for the purpose, so that approximately the same $V_{BE}$ characteristics are obtained for both transistor types.

FIG. 2A shows in detail that PNP transistors T1 and T2 are designed with merely four semiconductor zones. There, P1 is the common emitter zone, and P2 is the common collector zone for T1 and T2. The separate base zones are represented by N1 for T1, and by N2 for T2, which are separated from each other by oxide isolation zone 2'. Accordingly, for NPN transistors T3 and T4 semiconductor zones N3/P3/N34 and N4/P4/N34 are provided. The connecting lines for signal and voltage supply are represented only schematically with their respective contact positions, e.g., 3 for the contact of the supply voltage line with the P1-zone. It is obvious that in the manner shown a logic circuit of very high packing density can be obtained, the packing density being increased as compared with CMOS circuits as the transistors can all be designed with minimum dimensions. This is possible because the static power dissipation of this circuit technology is negligible compared with the dynamic power, as will be explained below in detail.

With respect to the manufacturing processes reference can be made on the one hand to the bipolar standard methods, e.g., with buried collector. As an alternative, the isolation can be achieved with isolating pits instead of with an isolating substrate, cp. the so-called EPIC process given in the book Integrated Circuits, McGraw-Hill Co., 1965, pp. 168 ff. Furthermore, the isolation can be performed by means of ion implantation of substances which together with the semiconductor form an isolation layer, or electrochemically for the selective generation of isolating zones.

The essential principles of the above described circuit technology explained with an embodiment, for carrying out boolean functions consists, on the one hand, in that for the dynamic state the switching current $I_{SW}$ is determined via the supply voltage $V_O$, as well as by the relations $$V_{BE} \approx V_O \text{ and } I_{SW} = f(V_{BE})$$

On the other hand, the steady-state power achievable in the steady state is predicated on the principle of the "regaining" of current $I_{SW}$ by means of re-injection, which is made possible through the deep saturation of the switching transistors and their high current gain in forward and inverted direction.

These principles will be specified and explained below by reference to a simple inverter chain, as shown in FIG. 3. To make matters less complicated, it is at first assumed that the characteristic features of both transistor types — apart from polarities — are identical.

For the stationary or steady state, as shown in FIG. 3, of the inverter chain it is assumed that input E is at the upper signal level $+V_O$, so that of the bipolar transistors which are complementary to each other, the NPN transistor T1N of the first inverter step, the PNP transistor T2P of the second inverter step, and NPN transistor T3N of the third inverter step are each saturation-conductive. This is indicated in FIG. 3 by the hatching of the respective transistor representations. The operating voltage of the inverter chain as derived by a control 4 from voltage V1 is $V_O$.

The static on-state of the inverter chain according to FIG. 3 is characterized by the relation:

$$V_{BE} = V_O - V_{CES} \quad (1)$$

In other words, the base-emitter voltage for instance of PNP transistor T2P is obtained from the difference of operating voltage $V_O$ and the saturation voltage of the conductive NPN transistor T1N. Stationary current $I_O$ per step is generated by the base current flowing in the saturation state. Said base current is low when the current gains in forward and inverted direction are high.

There applies:
$$I_O = I_B \approx [(1-\alpha_N) + (1-\alpha_I)] \cdot I_E (V_{BE}) \approx [(\beta_N+\beta_I)/\beta_N \cdot \beta_I] \cdot I_E (V_{BE}) \quad 2a$$

$\alpha_N$ and $\alpha_I$ representing the current gain factors in common base connection in normal and inverted direction, respectively, and $\beta_N$ and $\beta_I$ representing accordingly the current gains in common emitter connection, the following relation existing between $\alpha$ and $\beta$.

$$\beta = \alpha/(1-\alpha)$$

$I_E$ is the internal emitter injection current depending on the base-emitter voltage $V_{BE}$.

For symmetrical transistors there applies:

$$\beta_N = \beta_I = \beta$$

so that in this case, when it is assumed that $$1 + \beta \approx \beta$$

there applies the following:

$$I_O \approx (2/\beta) \cdot I_E (V_{BE}) \quad 2.$$

This expresses the above principles of regaining switching current $I_{SW}$ which as a maximum is $$I_{SW} \approx I_E (V_{BE}) \quad 3.$$

This regaining of the switching current and thus of the low stationary current can be approximately specified as follows: After the switching of the circuit capacities connected to the respective input or output nodes injection currents flow in the saturation conductive transistors not only in normal direction, i.e., injected by the emitter, but also via the collector-base junction which is then poled in forward direction, so that externally there appears only the difference current in the stationary state which is very low with symmetrical transistors.

Pursuant to the equation (3) derived above it is now observed that $V_{BE}$ is predetermined by $V_O$ (operating voltage) and saturation voltage $V_{CES}$ (compare equation (1)), so that, under the above assumption of equal current gain factors the ratio of maximum switching current to stationary current is $$I_{SW}/I_O = \beta/2 \quad 4$$

With a current gain of 100 in both directions a ratio of switching to static power of 50 is therefore obtained.

For the case of real logic functions there is for this ratio considering the number of inputs (fan in = FI), or the number of outputs (fan out = FO)

$$I_{SW}/I_O = \beta/(FI+FO) \quad 5$$

If divergently from the hitherto followed assumption the transistors are not strictly symmetrical in their characteristics the lower current gain value is substantially effective. In that case, the value of the mean current gain $\bar{\beta}$ instead of $\beta/2$ has to be applied. There applies:

$$\bar{\beta} = \beta_N \cdot \beta_I/(\beta_N+\beta_I)$$

An incomplete corresponding of the two transistor types has the effect that according to the respective switching states the static and corresponding switching currents are different. The latter, however, merely causes unequal leading and trailing edges of the signal pulses. If for instance a ratio of the switching currents with positive charging, compared with the negative charge of $\leq 3$ is permitted (corresponding to e approximately), then $|\Delta V_{BE}| \leq 26\text{mV}$ (temperature voltage) of the two transistor types can be accepted.

Different saturation voltages $V_{CES}$ — compare equation (1) — can hardly be of any effect in that they are low per se, for owing to the demand for low static power high inverted current gains are required. An essential component of the saturation voltage, however, is the so-called offset voltage $V_{offset}$. This offset voltage represents the collector-emitter voltage at a collector current $I_C = 0$. At a high inverted current gain the offset voltage is very low. There applies:

$$|V_{offset}| = V_T \cdot \ln \alpha_I \quad \alpha_I = \beta_I/(1+\beta_I)$$

$V_T$ = temperature voltage Example:

$$\alpha_I \geq 0.9 \; (\beta_I \geq 9) \quad |V_{offset}| \approx 2.5 \text{ mv}.$$

The suggested circuit technology can be realized with conventional bipolar processes, e.g., the standard process with buried collector, particularly when a passive isolation is used, to obtain complementary transistors with the desired characteristics.

Below we give an example for entirely lateral structures in silicon on an isolating substrate, e.g. sapphire.

The assumption of equal base-emitter voltages depending on emitter injection current $V_{BE}(I_E)$ for the PNP and NPN transistors represents equal saturation currents $I_S$ according to the equation.

$$I_E = I_S \cdot (\exp \cdot \frac{V_{BE}}{KT/q} - 1) \qquad (7)$$

There applies:

$$I_{S(PNP)} = \frac{A}{W_B} \cdot \mu_p \cdot P_n \cdot k \cdot T$$

$$= \frac{A}{W_B} \cdot \frac{\mu_p}{N_D} \cdot n_i^2 \cdot kT \qquad (8)$$

The symbols represent the following:
$q$ = elementary charge
$A$ = surface of the emitter-base junction
$W_B$ = base width
$\mu_p$ = mobility of the minority carriers (here holes: $p$) in the base
$p_n$ = concentration of the minority carriers in the base (here holes p in n-zone)
$n_i$ = intrinsic concentration
$N_D$ = majority carrier density in the base (here donors)

If the equation corresponding to equation (8) is established for the saturation current of an NPN transistor the demand is that both saturation currents are equal, i.e.

$$I_{S(PNP)} = I_{S(NPN)} \qquad 9$$

assuming furthermore the same geometry of the two transistor types the relation:

$$\mu_p/N_D = \mu_n/N_A \qquad 10$$

The symbols represent:
$\mu_n$ = mobility of the minority carriers (here electrons: n) in the base of the NPN transistor
$N_A$ = density of the majority carriers (here acceptors) in the base of the NPN transistor Equation (10) is for instance given the following dopings:

| | |
|---|---|
| PNP | $N_D = 10^{16} \text{cm}^{-3}$ |
| | $\mu_p = 400 \text{ cm}^2/VS$ |
| NPN | $N_A = 2 \cdot 10^{16} \text{cm}^{-3}$ |
| | $\mu_n = 800 \text{ cm}^2/VS$ |

In the given example, equal base widths for the complementary transistors are assumed which, however, it not necessary in each case. The above mentioned resulting dopings can e.g. be arrived at quite well by means of ion implantation, and the techniques known in this field can be employed for this purpose. The emitters or collectors can be sufficiently ($> 10^{18} \text{cm}^{-3}$) doped in this case in order to reach the desired high current gain. Implantation technology offers a hitherto unsurpassed possibility for manufacturing control in that all process-sensitive parameters, as overall amount of the impurities and penetration depth can be determined by means of electric values directly during the manufacturing process. In connection with a possible thermic additional treatment of the implanted zones an otherwise impossible control and equal distribution of the electric operation data can be achieved. Other combinations of dopings and geometry are equally possible in addition thereto.

As already explained above the suggested circuitry technology is based on the principle that the switching current is determined over operating voltage $V_O$. The voltage $V_O$ corresponding approximately to the height of the base-emitter voltage. The demands to be made to the precise adjustability and constancy of operating voltage $V_O$ are met, according to an advantageous embodiment of the invention, by the control circuit shown in FIG. 4. In the left-hand part of FIG. 4 a logic circuit is indicated schematically in partly interrupted lines which is to be supplied with operating voltage $V_O$. Transistors T2', T3' and T4' correspond for instance to transistors T2, T3 and T4 of the logic gate according to FIG. 1. Operating voltage $V_O$ is to be avilable at output terminals F and G. $V_O$ is derived from the non-controlled operating voltage +V1. Transistors TX1 and TX2 provided in the control circuit, represent in their characteristics compare transistors which in their properties are as similar as possible to the corresponding complementary transistors of the logic circuit. The collector current of PNP compare transistor TX1 is compared there with a nominal value by means of the voltage comparison. For that purpose, the collector current representing the maximum switching current $I_{SW}$ is converted from TX1 via resistor R1 in the collector branch into a voltage. As compare voltage the base-emitter voltage of the NPN transistor TX2 is used. With a rising temperature the switching current, therefore, decreases. This is necessary, for thus the switching time remains constant because the logic voltage swing decreases with $V_{BE}$. R2 represents the operating resistance for TX2. If less current $I_{SW}$ than the nominal value is flowing TX2 becomes less conductive and supplies more current to transistor $T_H$ which thereby increases $V_O$. With a too low current $I_{SW}$ the effect is reversed. The emitter of TX2 can either be applied with the emitter of transistor $T_H$ to a common, preferably a ground potential, or to a separate (negative) auxiliary voltage V2.

FIG. 5 shows, as another embodiment of the invention, the logic circuit which is dual to the circuit of FIGS. 1 or 2C, respectively. It is obvious that at output C the potential $+V_O$ occurs only when both input variables (A,B) show the lower voltage level $V_R$. Or potential $V_R$ appears at the output when at least one input variable adopts the upper voltage level. Consequently, this circuit, with a positive logic being assumed, is a NOR gate.

The advantages that can be achieved with the suggested circuit technology consist on the one hand in that the static power is negligible compared with the dynamic power. Owing to the much lower voltage swing of these bipolar circuits a much better power x delay product is obtained as compared with a logic circuit consisting of complementary field effect transistors. Compared with CMOS the suggested bipolar complementary circuit technology offers the advantages of the lower supply voltage and particularly of the lower logic signal swing, with the consequence of a much lower dynamic power dissipation. For power dissipation P there applies:

$$P \sim C \cdot U^2$$

C being the circuit capacity.

Thus, there applies for the comparison of the dynamic power dissipations of the suggested bipolar technology compared with CMOS.

$$\frac{P_{Bipolar}}{P_{CMOS}} \approx \frac{(0.7V)^2}{(5V)^2} \approx \frac{1}{50}$$

Additionally, which is not expressed in the comparative relation, the speed is increased. Finally, a packing density which is much higher than that possible with CMOS is achieved as the bipolar transistors can all be designed with minimum dimensions.

A summary of the preferred embodiment of the invention is set-forth, in progressively greater specificity in the following numbered paragraphs.

1. A complementary transistor circuit for carrying out boolean functions of at least two input variables, particularly in integrated semiconductor networks, characterized by the following features:
   a. the transistors are bipolar transistors;
   b. the input variables are coupled respectively to the control electrodes of a first transistor, and of a second transistor complementary thereto and provided in the load branch of said first transistor;
   c. with respect to their switching characteristics, particularly their current gain factors in normal and inverted direction, the bipolar transistors are almost symmetrical.

2. A transistor circuit as recited in numbered paragraph (1) further characterized in that the transistor current gains in normal and inverted operation are $$\beta_N >> 1, \beta_I >> 1$$

3. A transistor circuit as recited in numbered paragraph (2) further characterized in that the supply voltage has about the height of the base-emitter voltage of the bipolar transistors in the conductive state.

4. A transistor circuit as recited in numbered paragraph (3) further characterized in that the supply voltage is derived from a control circuit where the collector current of a comparable transistor of the one conductivity type is compared in the switched-in state with the base-emitter voltage of a bipolar transistor complementary thereto and designed as comparable transistor to the logic transistors of this conductivity type, so that the switching current and thus the signal voltage swing available decrease with rising temperature, in accordance with the height of the base-emitter voltage.

5. A transistor circuit as recited in numbered paragraph (4) further characterized in that the bipolar transistors are at least partly of lateral design.

6. A transistor circuit as recited in numbered paragraph (5) further characterized in that it is designed in silicon-on-sapphire technology.

7. A transistor circuit as recited in numbered paragraph (6) further characterized by a passive isolation of the circuit components, preferably by an oxide isolation.

8. A transistor circuit as recited in numbered paragraph (7) further characterized in that for realizing a NAND or NOR gate according to the number of input variables to a series or parallel arrangement, respectively, combined bipolar transistors of the one conductivity type are provided, with which, quasi connected in the load branch, an equal amount of bipolar transistors of the conductivity type complementary thereto and combined into a parallel or series arrangement, are provided whose connecting point forms the circuit output, and that the control electrodes of the transistors which are complementary to each other are arranged in parallel in respective pairs.

9. A transistor circuit as recited in numbered paragraph (8) further characterized in that the maximum switching current is determined via the supply voltage which is derived from the base-emitter voltage of a compare transistor in the conductive state.

10. A transistor circuit as recited in numbered paragraph (9) further characterized in that the parameter adjustment of the logic transistors, particularly their gain factor, is such that in the stationary state, owing to saturation of the conductive transistors, to the injection current via the emitter-base junction approximately the same injection current via the collector-base junction is added.

11. A transistor circuit as recited in numbered paragraph (10) further characterized in that the doping of the semiconductor zones is performed by means of ion implantation.

While the invention has been described and shown particularly with reference to one of its preferred embodiments, it will be understood by those skilled in the art to which the work is directed that various changes in form and detail may be made without departing from either the spirit or scope of the invention.

What is claimed is:

1. A logic circuit for carrying out a boolean function of at least two input variables, said logic circuit comprising:
   a first PNP transistor having a collector, base and emitter;
   a second PNP transistor having a collector, base and emitter;
   a first NPN transistor having a collector, base and emitter;
   a second NPN transistor having a collector base and emitter;
   a first input terminal adapted to receive a first binary input signal;
   a second input terminal adapted to receive a second binary input signal;
   an output terminal;
   first passive connection means connecting in common said first input terminal, said base of said first PNP transistor, and said base of said first NPN transistor;
   second passive connection means connecting in common said second input terminal, said base of said second PNP transistor, and said base of said second NPN transistor;
   third passive connection means connecting said emitter of said first NPN transistor to said collector of said second NPN transistor;

fourth passive connection means connecting said emitter of said first PNP transistor and said emitter of said second PNP transistor to a first potential;

fifth passive connection means connecting said emitter of said second NPN transistor a second potential; and sixth passive connection means connecting said collector of said first PNP transistor, said collector of said second PNP transistor, and said collector of said first NPN transistor to said output terminal, whereby in response to first and second binary input signals respectively impressed on said first and second input terminals said output terminal manifests a binary output signal which is the boolean function of said first and second binary inputs.

2. A logic circuit for carrying out a boolean function of at least two input variables as recited in claim 1 wherein said first passive connection means connects in common said first input terminal, said base of said first PNP transistor, and said base of said second NPN transistor; and, said second passive connection means connects in common said second input terminal, said base of said second PNP transistor, and said base of said first NPN transistor.

3. A logic circuit for carrying out a boolean function of at least two variables as recited in claim 1, wherein said first NPN transistor, said second NPN transistor, said first PNP transistor, and said second PNP transistor are respectively laterally disposed within a monolithic body of semiconductor material.

4. A logic circuit for carrying out a boolean function of at least two variables as recited in claim 2, wherein said first NPN transistor,
said second NPN transistor,
said first PNP transistor, and said second PNP transistor are respectively laterally disposed within a monolithic body of semiconductor material.

5. A logic circuit for carrying out a boolean function of at least two input variables, as recited in claim 3 wherein said emitters of said first and second PNP transistors are formed by a first integral zone of P-type material within said monolithic body of semiconductor material;

said collectors of said first and second PNP transistors are formed by a second integral zone of P-type material within said monolithic body of semiconductor material; and, said emitter of said first NPN transistor, and said collector of said second NPN transistor are formed by a third integral zone of N type material within said monolithic body of semiconductor material.

6. A logic circuit for carrying out a boolean function of at least two input variables, as recited in claim 4 wherein said emitters of said first and second PNP transistors are formed by a first integral zone of P-type material within said monolithic body of semiconductor material;

said collectors of said first and second PNP transistors are formed by a second integral zone of P-type material within said monolithic body of semiconductor material; and, said emitter of said first NPN transistor and said collector of said second NPN transistor are formed by a third integral zone of N type material within said monolithic body of semiconductor material.

7. In a data processing system, a logic circuit for carrying out a boolean function of at least two input variables as recited in claim 6 wherein said logic circuit carries out the logical NAND function.

8. In a data processing system, a logic circuit for carrying out a boolean function of at least two input variables as recited in claim 6 wherein said logic circuit carries out the logical NOR function.

9. In a data processing system, a logic circuit for carrying out a boolean function of at least two input variables as recited in claim 5 wherein said circuit carries out the logical NAND function.

10. In a data processing system, a logic circuit for carrying out a boolean function of at least two input variables as recited in claim 5, wherein said circuit carries out the logical NOR function.

11. A logic circuit for carrying out a boolean function of n input variables, where n is an integer equal to or greater than two, said logic circuit comprising:

n PNP transistors, each PNP transistor having a collector, base and emitter;

n NPN transistors, each NPN transistor having a collector, base and emitter;

n input terminals respectively adapted to receive a predetermined one of n binary input signals;

an output terminal;

n passive connection means, each of said n passive connection means connecting in common one of said n input terminals, the base of one of said PNP transistors, and the base of one of said NPN transistors;

first passive circuit means connecting said emitter of each of said n PNP transistors to a first potential;

second passive circuit means connecting said collector of each of said n PNP transistors to said output terminal;

third passive circuit means connecting said collector of said first one of said n NPN transistors to said output terminal;

fourth passive circuit means connecting said emitter of said nth NPN transistor to a second potential;

and additional passive circuit means respectively connecting each said emitter of said first through n-lth NPN transistors to a discrete one of said collectors of said second through nth NPN transistors, whereby in response to n binary input signals, respectively impressed on said n input terminals, said output terminal manifests a binary output signal which is the boolean function of said n binary inputs.

12. A logic circuit for carrying out a boolean function of n input variables as recited in claim 11, wherein said n PNP transistors and said n NPN transistors are respectively laterally disposed within a monolithic body of semiconductor material.

13. A logic circuit for carrying out a boolean function of n input variables as recited in claim 12, wherein at least two of said emitters of said n PNP transistors are formed by a first integral zone of P-type material;

at least two of said collectors of said n PNP transistors are formed by a second integral zone of P-type material within said monolithic body of semiconductor material;

and at least the emitter of one of said n NPN transistors and the collector of a second one of said n NPN transistors are formed by a third integral zone of N type material within said monolithic body of semiconductor material.

14. In a data processing system, a logic circuit for carrying out a boolean function of n input variables as recited in claim 13 wherein said logic circuit carries out the logical NAND function.

15. In a data processing system, a logic circuit for carrying out a boolean function of n input variables as recited in claim 13 wherein said logic circuit carries out the logical NOR function.

16. A logic circuit for carrying out a boolean function of at least two input variables,
said logic circuit comprising:
a first PNP transistor having a collector, base and emitter;
a second PNP transistor having a collector, base and emitter;
a first NPN transistor having a collector, base and emitter;
second NPN transistor having a collector, base and emitter;
a first input terminal adapted to receive a first binary input signal;
a second input terminal adapted to receive a second binary input signal;
an output terminal;
first passive connection means connecting in common said first input terminal, said base of said first NPN transistor, and said base of said first PNP transistor;
second passive connection means for connecting in common said second input terminal, said base of said second NPN transistor, and said base of said second PNP transistor;
third passive connection means connecting said collector of said first PNP transistor to said emitter of said second PNP transistor;
fourth passive connection means connecting said emitter of said first NPN transistor, and said emitter of said second NPN transistor to a first potential;
fifth passive connection means connecting said emitter of said first PNP transistor to a second potential;
and sixth passive connection means connecting said collector of said first NPN transistor,
said collector of said second NPN transistor and said collector of said second PNP transistor to said output terminal, whereby
in response to first and second binary input signals respectively impressed on said first and second input terminals said output terminal manifests a binary output signal which is the boolean function of said first and second binary inputs.

17. A logic circuit for carrying out a boolean function of at least two input variables, as recited in claim 16 wherein
said first passive connection means connects in common said first input terminal, said base of said first NPN transistor and said base of said second PNP transistor; and,
said second passive connection means connects in common said second input terminal, said base of said second NPN transistor, and said base of said first PNP transistor.

18. A logic circuit for carrying out a boolean function of at least two input variables as recited in claim 16 wherein
said first NPN transistor,
said second NPN transistor,
said first PNP transistor, and said second PNP transistor are respectively laterally disposed within a monolithic body of semiconductor material.

19. A logic circuit for carrying out a boolean function of at least two input variables as recited in claim 17 wherein said first NPN transistor,
said second NPN transistor,
said first PNP transistor, and said second PNP transistor are respectively laterally disposed within a monolithic body of semiconductor material.

20. A logic circuit for carrying out a boolean function of at least two input variables, as recited in claim 18 wherein said emitters of said first and second NPN transistors are formed by a first integral zone of N type material within said monolithic body of semiconductor material;
said collectors of said first and second NPN transistors are formed by a second integral zone of N type material within said monolithic body of semiconductor material; and,
said collector of said first PNP transistor, and said emitter of said second PNP transistor are formed by a third integral zone of P type material within said monolithic body of semiconductor material.

21. A logic circuit for carrying out a boolean function of at least two input variables, as recited in claim 19 wherein said emitters of said first and second NPN transistors are formed by a first integral zone of N type material within said monolithic body of semiconductor material;
said collectors of said first and second NPN transistors are formed by a second integral zone of N type material within said monolithic body of semiconductor material; and,
said collector of said first PNP transistor, and said emitter of said second PNP transistor are formed by a third integral zone of P type material within said monolithic body of semiconductor material.

22. In a data processing system, a logic circuit for carrying out a boolean function of at least two input variables as recited in claim 21 wherein said logic circuit carries out the logical NAND function.

23. In a data processing system, a logic circuit for carrying out a boolean function of at least two input variables as recited in claim 21 wherein said logic circuit carries out the logical NOR function.

24. In a data processing system, a logic circuit for carrying out a boolean function of at least two input variables as recited in claim 20 wherein said logic circuit carries out the logical NAND function.

25. In a data processing system, a logic circuit for carrying out a boolean function of at least two input variables as recited in claim 20 wherein said logic circuit carries out the logical NOR function.

26. A logic circuit for carrying out a boolean function of n input variables, where n is an integer equal to or greater than two, said logic circuit comprising:
n PNP transistors, each PNP transistor having a collector, base and emitter;
n NPN transistors, each NPN transistor having a collector, base and emitter;
n input terminals respectively adapted to receive a predetermined one of n binary input signals;
an output terminal;
n passive connection means, each of said n passive connection means connecting in common one of said n input terminals, the base of one of said NPN transistors, and the base of one of said PNP transistors;

first passive circuit means connecting said emitter of each of said n NPN transistors to a first potential;

second passive circuit means connecting said collector of each of said n NPN transistors to said output terminal;

third passive circuit means connecting said collector of said first one of said n PNP transistors to said output terminal;

fourth passive circuit means connecting said emitter of said nth PNP transistor to a second potential;

and additional passive circuit means respectively connecting each said collector of said second through nth NPN transistors to a discrete one of said emitters of said first through nth NPN transistors, whereby in response to n binary input signals, respectively impressed on said n input terminals, said output terminal manifests a binary output signal which is the boolean function of said n binary inputs.

27. A logic circuit for carrying out a boolean function of n input variables as recited in claim 26, wherein said n PNP transistors and said n NPN transistors are respectively laterally disposed within a monolithic body of semiconductor material.

28. A logic circuit for carrying out a boolean function of n input variables as recited in claim 27, wherein at least two of said emitters of said n NPN transistors are formed by a first integral zone of N type material;

at least two of said collectors of said n NPN transistors are formed by a second integral zone of N type material within said monolithic body of semiconductor material;

and at least the emitter of one of said n PNP transistors and the collector of a second one of said n PNP transistors are formed by a third integral zone of P type material within said monolithic body of semiconductor material.

29. In a data processing system, a logic circuit for carrying out a boolean function of n input variables as recited in claim 28 wherein said logic circuit carries out the logical NAND function.

30. In a data processing system, a logic circuit for carrying out a boolean function of n input variables as recited in claim 28 wherein said logic circuit carries out the logical NOR function.

31. In a semiconductor device comprising a plurality of lateral disposed transistors of first and second conductivity type, wherein said first and second conductivity types are opposite one to the other, said device including:

a body of semiconductor material having at least one substantially planar surface;

a first region having said first conductivity type;

said first region lying on and extending into said planar surface of said semiconductor material;

a second region having said first conductivity type;

said second region lying on and extending into said planar surface of said semiconductor material;

said first and second regions being displaced on said planar surface a small distance one from the other;

a third region having said second conductivity type;

said third region lying on and extending into said planar surface of said semiconductor material;

a fourth region having said second conductivity type;

said fourth region lying on and extending into said planar surface of said semiconductor material;

said third region being displaced on said planar surface a small distance from said fourth region;

said third region having a portion thereof which extends between and abuts a portion of said first region and a portion of said second region;

said fourth region having a portion thereof which extends between and abuts a portion of said first region and a portion of said second region;

a fifth region having said second conductivity type;

said fifth region lying on and extending into said planar surface of said semiconductor material;

a sixth region having said second conductivity type;

said sixth region lying on and extending into said planar surface of said semiconductor material;

a seventh region having said second conductivity type;

said seventh region lying on and extending into said planar surface;

said fifth, sixth and seventh regions being respectively displaced a small distance one from another on said planar surface;

an eighth region of said first conductivity type;

said eighth region lying on and extending into said planar surface;

a ninth region of said first conductivity type;

said ninth region lying on and extending into said planar surface;

said eighth region having a portion thereof which extends between and abuts a portion of said fifth region and a portion of said seventh region;

said ninth region having a portion thereof which extends between and abuts a portion of said fifth region and a portion of said sixth region;

whereby a first laterally disposed transistor of said first conductivity type is formed by the said first, second and third regions, a second laterally disposed transistor of said first conductivity type is formed by said first, second and fourth regions, a first laterally disposed transistor of said second conductivity type is formed by said fifth, seventh and eighth regions, and a second laterally disposed transistor of said second conductivity type is formed by said sixth, seventh and ninth regions.

32. In a semiconductor device as recited in claim 31 wherein circuit means is provided for interconnecting said transistors of said first and second conductivity type into a NAND gate.

33. In a semiconductor device as recited in claim 31, wherein circuit means is provided for interconnecting said transistors of said first and second conductivity type into a NOR gate.

* * * * *